(12) United States Patent
Bacon et al.

(10) Patent No.: US 8,306,764 B2
(45) Date of Patent: Nov. 6, 2012

(54) BATTERY ANALYSIS INTERFACE AND MEASUREMENT SYSTEM

(75) Inventors: Daniel P. Bacon, Woodinville, WA (US); David Ross Jenkinson, Auburn, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 402 days.

(21) Appl. No.: 12/729,154

(22) Filed: Mar. 22, 2010

(65) Prior Publication Data

US 2011/0231123 A1    Sep. 22, 2011

(51) Int. Cl.
*G01R 31/00*    (2006.01)
(52) U.S. Cl. ......................................................... 702/63
(58) Field of Classification Search .................... 702/63, 702/64, 66, 182–185
See application file for complete search history.

(56) References Cited

U.S. PATENT DOCUMENTS

| | | | |
|---|---|---|---|
| 3,974,441 A | | 8/1976 | Van Den Haak |
| 6,913,483 B2 | | 7/2005 | Restaino et al. |
| 7,076,375 B2 | * | 7/2006 | Raichle et al. .................. 702/63 |
| 7,505,856 B2 | * | 3/2009 | Restaino et al. ................. 702/63 |
| 7,598,700 B2 | * | 10/2009 | Elder et al. ..................... 320/106 |
| 7,737,581 B2 | * | 6/2010 | Spurlin et al. .................. 307/66 |
| 2004/0212342 A1 | | 10/2004 | Batson |
| 2005/0057256 A1 | | 3/2005 | Bertness |

OTHER PUBLICATIONS

PCT Search Report and Written Opinion mailed Sep. 28, 2011 for PCT Application No. PCT/US11/28530, 11 pages.

* cited by examiner

*Primary Examiner* — Edward Raymond
(74) *Attorney, Agent, or Firm* — Lee & Hayes, PLLC

(57) ABSTRACT

A battery analysis interface enables measurement of a performance of an internal battery while the battery powers an electronic device. The battery analysis interface is configured to connect an analysis device to the battery located within a battery compartment of the electronic device and enclosed by a battery cover. In this way, the battery analysis interface may enable testing of the battery's performance while the electronic device is fully assembled (i.e., the battery cover is secured to electronic device). The battery analysis interface may be connected to directly to terminals on the battery and/or electronic device or connected to the terminals via wires or strips of conductive material.

20 Claims, 6 Drawing Sheets

BOTTOM VIEW

BATTERY ANALYSIS INTERFACE AND MEASUREMENT SYSTEM

BACKGROUND

Numerous electronic devices, and particularly handheld communication devices, such as telecommunication devices, are manufactured and often updated during a lifecycle of the electronic device. The electronic devices may undergo tests of the electronic device's hardware, software, and communication functionality during and subsequent to the development and design of the electronic device and prior to large scale production and distribution of a new electronic device or of new software to run on a new or legacy electronic device.

Many electronic devices are powered by internal batteries, which provide a primary power supply and allow mobility of the electronic device. Often, the batteries are located within a cavity (i.e., battery compartment) in the electronic device and enclosed by a battery cover. When attached to a housing of the electronic device, the battery cover may seal the battery within the cavity and leave little or no accessibility or visibility to the battery without removing the battery cover. The battery cover performs multiple functions that include protecting the battery from contact with outside elements (water, human contact, etc.) while continuing contours of the housing of the electronic device to create an aesthetic appearance of the device.

It is often important to test battery performance while the battery is powering an electronic device. In addition, it is often important to test the electronic device in a final assembled state as used by end users to ensure that the electronic device performs as intended by design.

BRIEF DESCRIPTION OF THE DRAWINGS

The detailed description is described with reference to the accompanying figures. In the figures, the left-most digit(s) of a reference number identifies the figure in which the reference number first appears. The same reference numbers in different figures indicate similar or identical items.

DETAILED DESCRIPTION

Overview

Often, batteries power portable electronic devices such as telecommunication devices (including smartphones), mobile computers, personal digital assistants (PDAs), tablet computers, single or multi-directional radios, calculators, and other electronic devices having an internal battery. It is often important to measure the performance of a battery while the battery is powering the electronic device that is operating under real or simulated user operation. For example, it may be useful to measure the performance of a battery while a user interacts with the electronic device having the battery securely contained within a battery compartment and enclosed by a battery cover. Battery performance may include measurements of voltage, current, capacity (full or as discharged), discharge rate/time, recovery, cycle life, internal impedance, temperature, and other battery metrics which indicate the performance of a battery while powering an electronic device. In some instances, user operation may be simulated by testing apparatus which may interact with the electronic device in various ways to simulate user operation of the electronic device.

Battery compartments are enclosed by a battery cover, which is typically designed to cover the battery and prevent access to the battery from a point external to a housing (or body) of the electronic device. In accordance with embodiments, a battery analysis interface is configured to connect an analysis device to a battery enclosed within a battery compartment within an electronic device and enclosed by a battery cover. In this way, the battery analysis interface may enable testing of the battery's performance while the electronic device is fully assembled (i.e., the battery cover is secured to the battery housing).

The battery analysis interface described herein may be implemented in a number of ways. Example implementations are provided below with reference to the following figures.

Illustrative Environment

Figure 1:
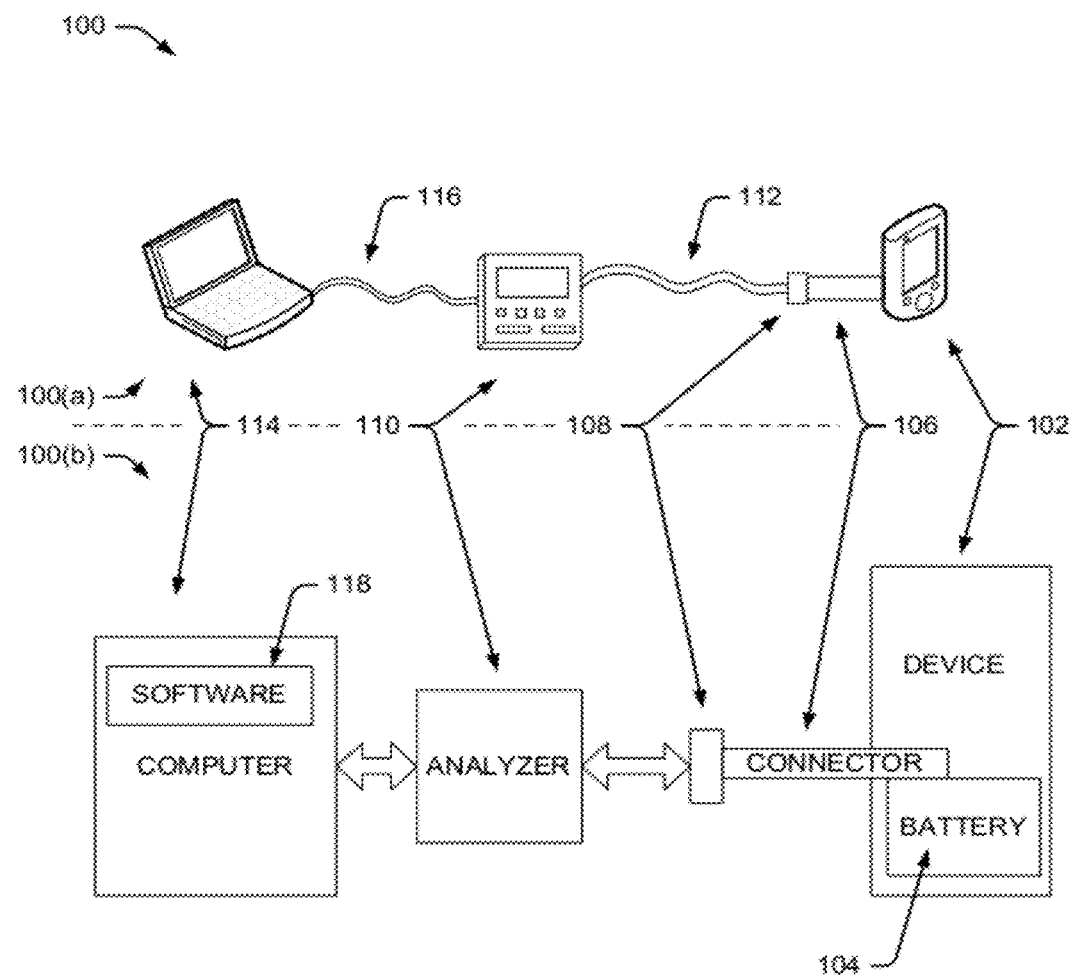
FIG. 1 is an illustrative environment showing an example battery interface to connect a battery enclosed within an electronic device to an analyzer device.

FIG. 1 is an illustrative environment 100 showing an example battery interface to connect a battery enclosed within an electronic device to an analyzer device. The environment 100 includes a pictorial diagram portion 100(a) and a block diagram portion 100(b) that show the example battery interface interacting with other components in the environment.

The environment 100 includes an electronic device ("device") 102 having a battery 104. The device may be any electronic device having an internal battery such as a telecommunication device, computing device, and so forth. The battery 104 may be an internal battery that is located within a battery compartment and of the electronic device 102 and enclosed by a battery cover.

A battery analysis interface 106 is operably connected to positive/negative (+/−) terminals of the battery 104 and/or the electronic device 102. The battery analysis interface 106 provides a connection to the battery 104 to enable an analysis of battery performance (current, voltage, etc.) of the battery while situated within the electronic device 102 and enclosed by the battery cover. The battery analysis interface 106 may include a coupling device 108 to connect to an analysis device 110 via a connector 112. The coupling device 108 may be a pin connector (12-pin, 6-pin, 9-pin, etc.) or another type of connector (universal serial bus (USB), mini-USB, soldered wires, etc.). The analysis device 110 may be a testing/analyzing device to measure battery performance of the battery 104. For example, the analysis device 110 may test/analyze voltage, current, capacity (full or as discharged), discharge rate/time, recovery, cycle life, internal impedance, temperature, and other battery metrics which indicate the performance of a battery while powering the electronic device 102. In some embodiments, the analyzer device 110 is a National Instruments USB data acquisition (DAQ) device manufactured by National Instruments Corporation of Austin, Tex.

A computer 114 may be connected to the analysis device 110 via a connector 116. The computer 114 may include software 118 to receive, store, analyze, output, or otherwise interact with data obtained from the battery 104 via the analysis device 110. In some embodiments, the software 118 may include a LabVIEW battery test program to interact with the analysis device (e.g., the USB DAQ). The computer 114 may execute the software 118 to measure the battery performance of the battery 104 while the battery is enclosed by the battery cover within the battery compartment of the electronic device 102. The electronic device 102 in the environment 100 may be operated by a human or a simulating apparatus to perform device operations while the analysis device 110 tests/analyzes performance of the battery 104. The electronic device 102 may run device software to execute commands, perform computations, provide a user interface and output a display, communicate with other devices via a wired or wireless network (mobile, Wi-Fi, Bluetooth®, etc.), or perform other device operations.

Illustrative Battery Interface

Figure 2:
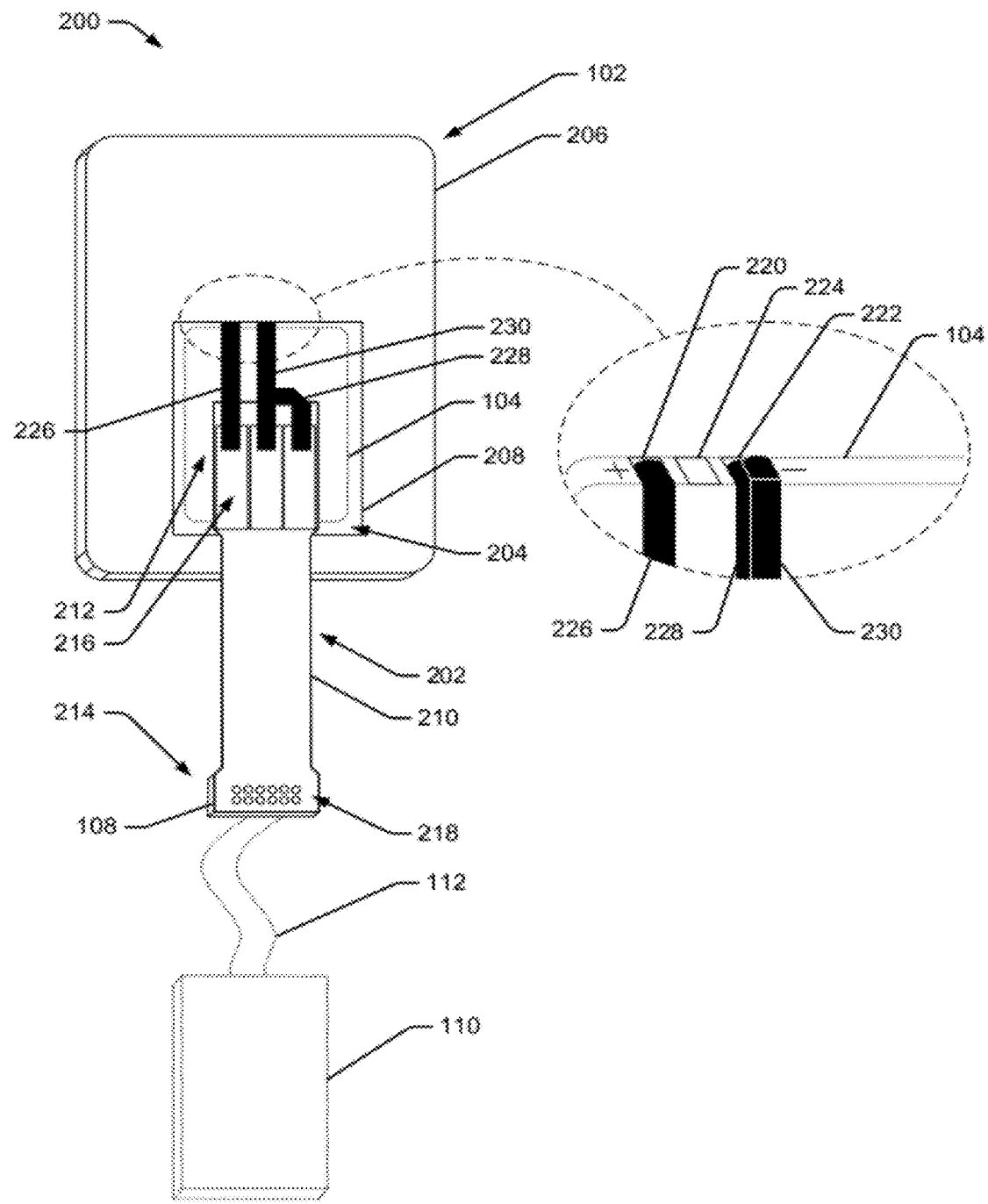
FIG. 2 is a schematic diagram of a battery connection system to connect a battery enclosed within an electronic device with an analyzer device via an illustrative battery interface.

FIG. 2 is a schematic diagram of a battery connection system 200 to connect a battery enclosed within an electronic device with an analyzer device via an illustrative battery interface 202. The battery interface 202 is one example implementation of the battery analysis interface 106 shown in FIG. 1 and will be described with reference to the environment 100.

As shown in FIG. 2, the battery 104 is situated within a battery compartment 204 of a housing 206 of the electronic device 102. A battery cover 208, when attached to the housing 206, may enclose the battery 104 within the battery compartment 204.

The battery interface 202 may include a body 210, a first end 212 (i.e., battery end), and a second end 214 (i.e., test measurement end) that is opposite the first end. The body may be formed of a thin layered flex cable, such as an engraved, etched, or stamped conductor (metallic) and non-conductor (ribbon, non-metallic) configuration. The first end 212 may be located proximate the battery 104 and include connector pads 216 that enable a connection with terminals of the battery 104 and/or the electronic device 102. In some embodiments, the connector pad 216 may include a positive (+) battery terminal pad, a negative (−) battery terminal pad, and a negative (−) electronic device pad. The second end 214 may include the coupling features 218 to enable coupling of the coupling device 108. In some embodiments, the coupling features 218 may include apertures that enable connection of a multi-pin connector as the coupling device 108.

The connector pads 216 may be in connection to wires (i.e., strips, connectors, joiners, etc.) to connect the respective connector pads 216 with terminals of the battery 104 and/or electronic device 102. The terminals of the battery may include a positive terminal (+) 220, a negative terminal (−) 222, and other terminals 224 that may be used to measure aspects of the battery (e.g., temperature, etc.). A first wire 226 may connect the positive (+) terminal 220 to a positive connector pad on the battery interface 202. A second wire 228 may connect the negative (−) terminal 222 to a negative connector pad on the battery interface 202. A third wire 230 may connect a negative (−) terminal of the electronic device 102 to another negative connector pad on the battery interface 202. The first wire 226 and second wire 228 may enable a measurement of voltage while the second wire 228 and the third wire 230 may enable a measurement of current. Other wire configurations are possible to enable analysis of battery performance (e.g., voltage, current, etc.) by the analyzer device 110 by coupling, via the battery interface 202, to respective battery terminals.

When connected to the battery 104 via the wires 226, 228, and 230, the battery interface 202 may be partially external to the electronic device 102 while the wires contact respective terminals of the battery 104 and/or the electronic device 102 within the battery compartment 204. In accordance with various embodiments, the wires 226, 228, and 230 do not interfere with an attachment of the battery cover 208 to the housing 206 of the electronic device 102 when the battery is situated within the electronic device 102 and connected to the battery interface 202. In some embodiments, the wires 226, 228, and 230 may be integrated with the battery interface 202 while in other embodiments, some or all of the wires may be separate from the battery interface. In some embodiments the wires may be integrally formed with the battery interface 202.

Figure 3:
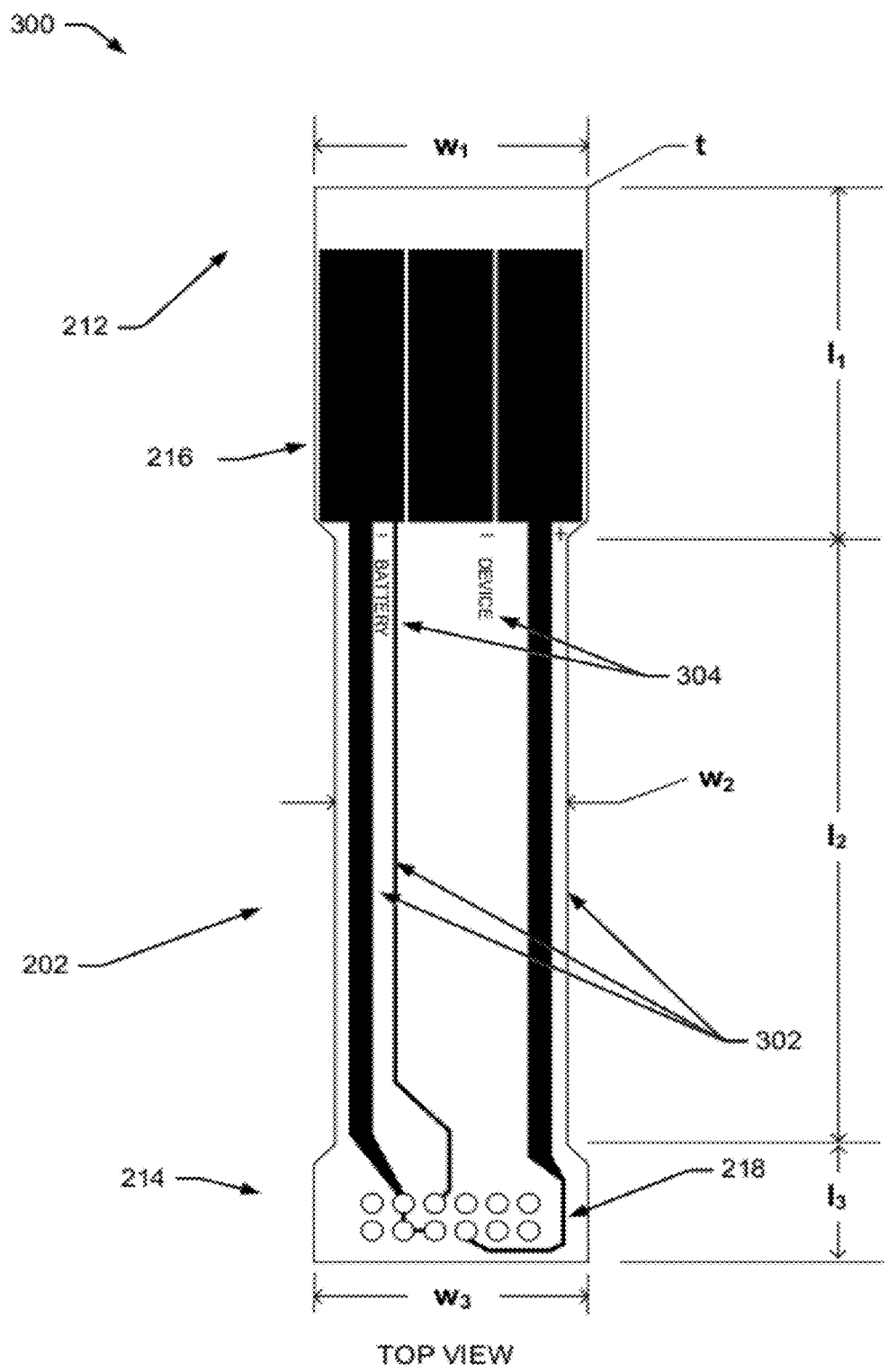
FIG. 3 is a top plan view of an illustrative top layer of the battery interface of FIG. 2.

FIG. 3 is a top plan view of an illustrative top layer 300 of the battery interface 202 of FIG. 2. The top layer 300 includes the connector pads 216, which may have wires or strips of conductive metals (e.g., copper) affixed to each respective pad at one end and the battery terminals at the opposite end of the wires or strips. The conductive wires/strips may be affixed by solder, conductive epoxy, conductive pressure sensitive adhesive (conductive tape), and so forth. In some embodiments, conductive epoxy may be used to attach the strips to the battery to reduce the exposure of the battery to heat.

The second end 214 may include coupling features 218 to enable coupling of the coupling device 108. In some embodiments, the coupling features 218 may include apertures (plated through holes) that enable connection of a multi-pin connector as the coupling device 108.

Leads 302 connect the connector pads 216 at the first end 121 to the coupling features 218 in accordance with a design schematic, which may be based on the type of coupling features 218 and/or the analysis device 110 (e.g., a USB DAQ, etc.).

Labels 304 may indicate a designated use for each of the connector pads 216, such as for a "device" or "battery" and/or "(+)," or "(−)," and/or provide other information about the battery interface 202.

The battery interface 202 may include dimensions of width ($w_1$, $w_2$ and $w_3$)), length l ($l_1$, $l_2$, and $l_3$)), and thickness t. In some embodiments, the width $w_1$ and length $l_1$ may be selected as dimensions great enough to enable soldering of the wires to the connector pads 216. For example, the width $w_1$ and length $l_1$ may be greater than or equal to ¾ inches to enable soldering of the wires 226, 228, and 230 to the connector pads 216. The thickness t may be less than or equal to 0.1 inches to enable flex of the battery interface without fracture and/or disruption of any of the connections described herein.

The width $w_2$ may be minimized to enable the battery interface 202 to extend from a location proximate the battery terminals to a location exterior to the battery compartment with minimized interference with the battery cover (e.g., latch, etc.) or other components. The width $w_2$ may be selected as a minimum width to support carrying appropriate levels of current. The length $l_2$ may selected to enable the battery interface 202 extend from a location proximate the battery terminals to a location exterior to the battery compartment. The width $w_3$ and the length $l_3$ may be selected to accommodate attachment of the coupling device 108.

In some embodiments, a section of the battery interface 202 defined by the measurements $w_2$ and $l_2$ may include a bend. The bend may enable routing the battery interface from within the battery compartment to a location outside of the battery compartment. The bend may be a ninety degree angle bend or another angle bend.

Figure 4:
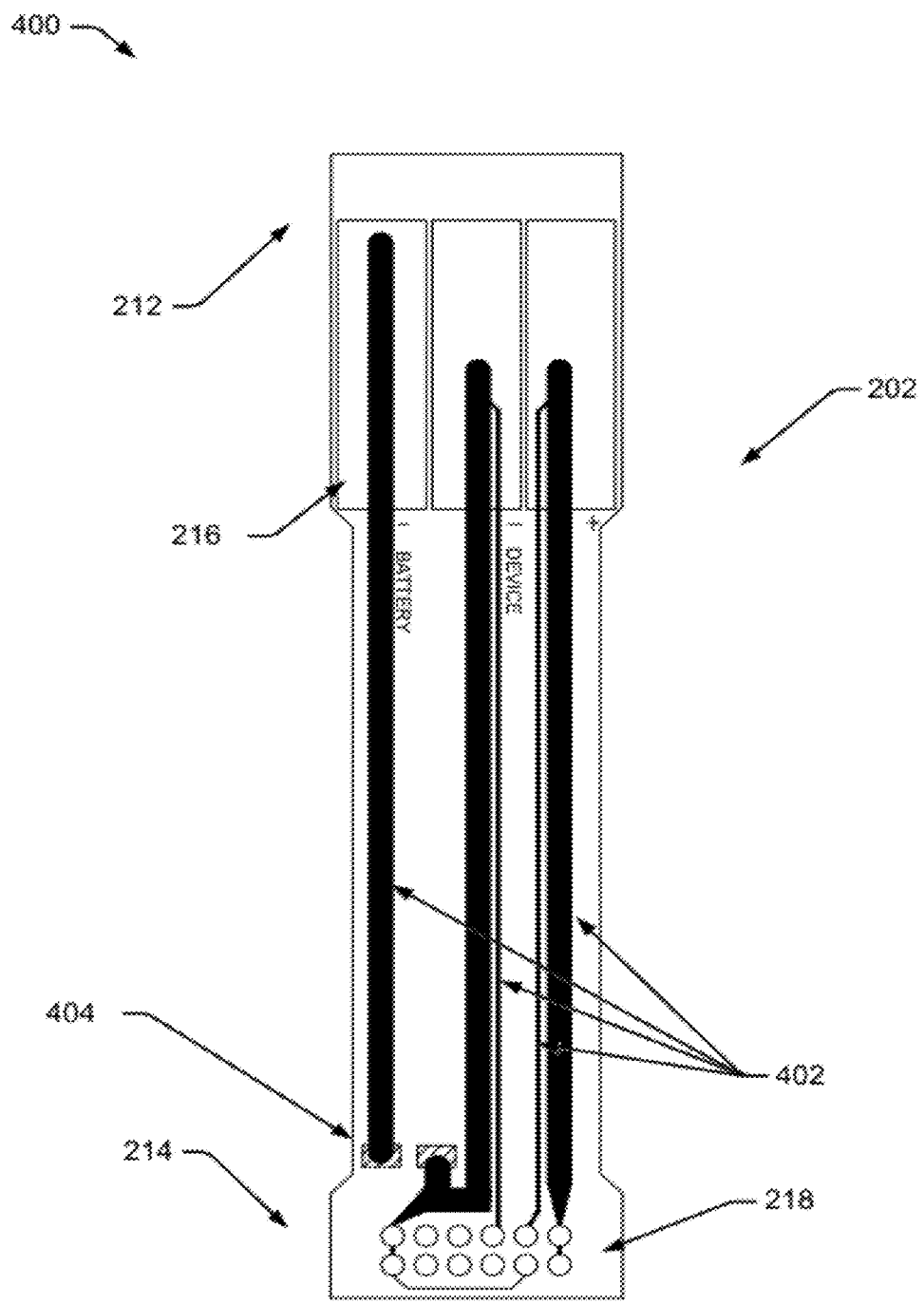
FIG. 4 is a bottom plan view of an illustrative bottom layer of the battery interface of FIG. 2.

FIG. 4 is a bottom plan view of an illustrative bottom layer 400 of the battery interface 202 of FIG. 2. The bottom layer may be a mirror reflection of the top layer 300 with the exception of the leads 402 that make different connections between the connector pads 216 and the coupling features 218 in accordance with the design schematic. In some embodiments, the connector pads 216 may be accessible via either the top layer 300 or the bottom layer 400 (i.e., electrically common on both sides). In this way, the connector pads 216 may be positioned to align with a polarity layout of the battery terminals (e.g., (+) terminal on right, (−) terminal on left, or vice versa) without having to cross connecting wires that connect the battery interface 202 to the battery terminals. Thus, the battery interface 202 may be flipped over to accommodate a polarity of a battery when the polarity does not align with an order (arrangement) the connector pads 216 on a side of the battery interface because access to the connector pads on the other side of the battery interface presents a mirror image of the connector pads as viewed from the first side.

Shunt pads 404 for an optional surface mount (SMT) shunt may be included on the battery interface 202 to connect the negative (−) terminal of the battery to the negative (−) terminal of the device, or other appropriate connections.

Although the layers are described herein as the top layer 300 and the bottom layer 400, these designations of top and bottom are arbitrary and only used for discussion purposes.

Figure 5:
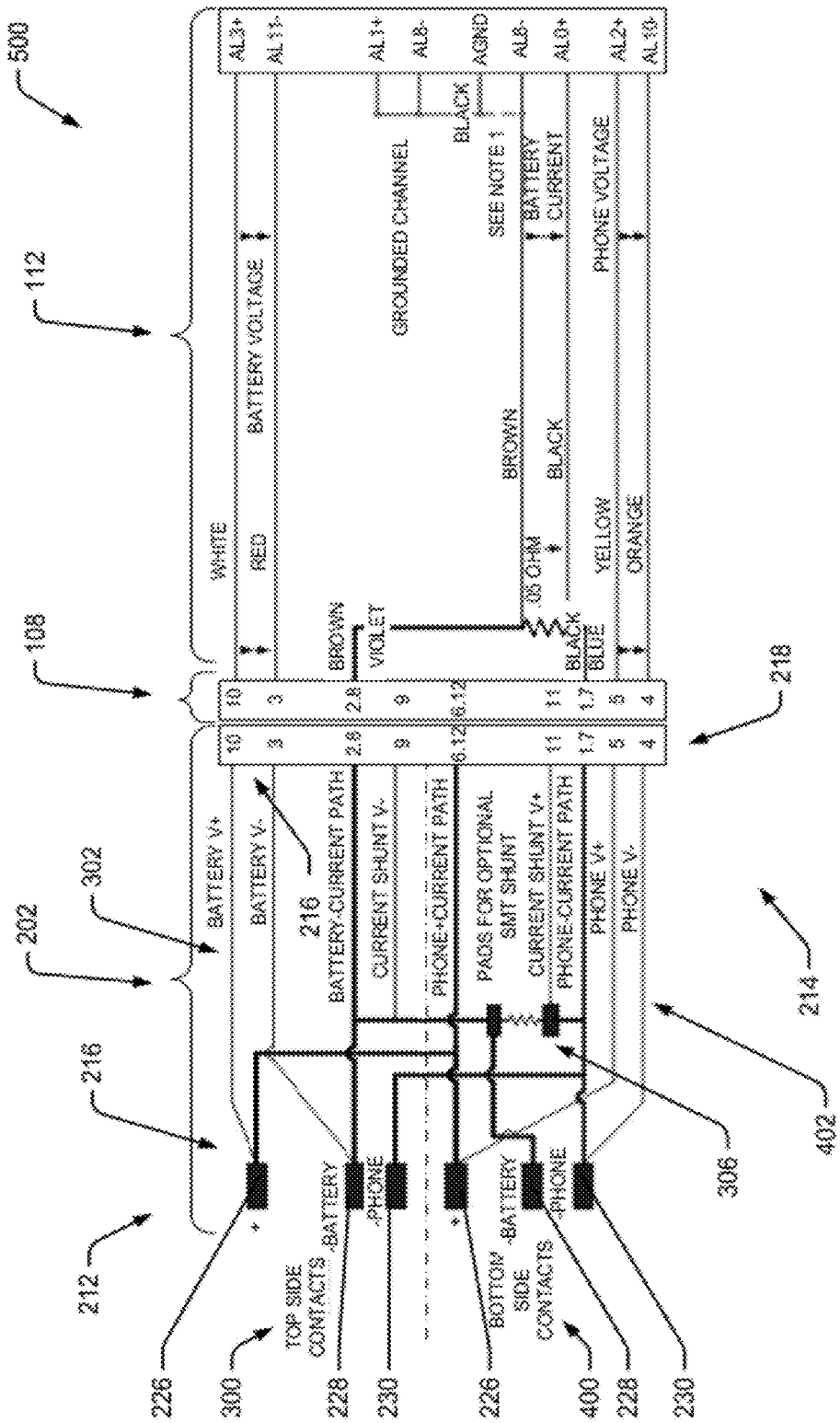
FIG. 5 is an illustrative design schematic of the battery interface 202 of FIG. 2.

FIG. 5 is an illustrative design schematic 500 of the battery interface 202 of FIG. 2. The design schematic 500 shows the top layer 300 and the bottom layer 400 of the battery interface 202 and leads 302 and 402, respectively.

The design schematic 500 shows the battery interface 202 aligned with the coupling device 108 and the connector 112. For example, the coupling device 108 may be a pin connector (12 pin, etc.), a USB coupling device to enable connection, via a USB cable, or other types of connectors to enable a connection between the battery interface 202 and the analysis device 110.

Illustrative Operation

Figure 6:
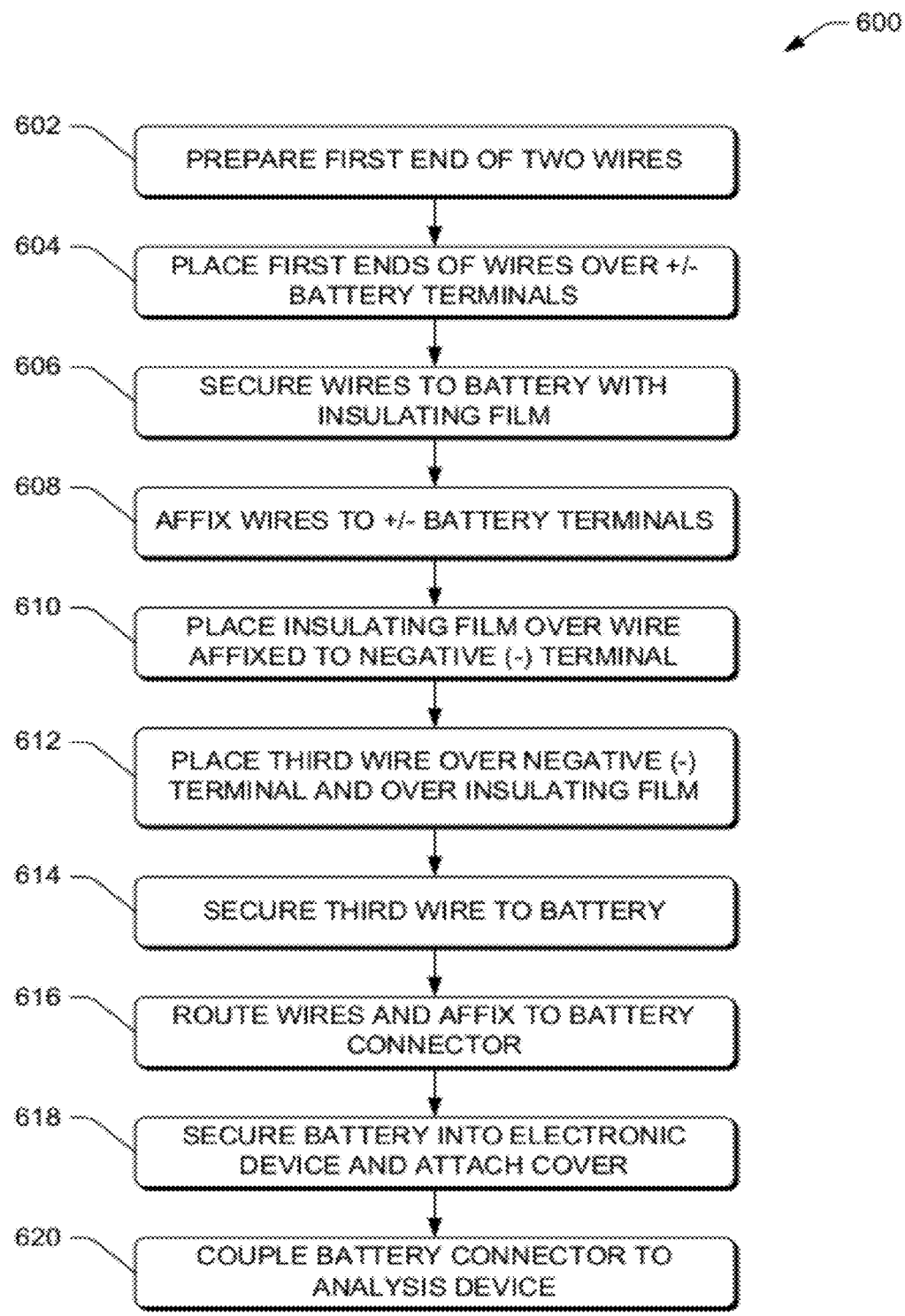
FIG. 6 is a flow diagram of an illustrative process to install the battery interface to a battery to be enclosed within a battery compartment and covered by a battery cover.

FIG. 6 is a flow diagram of an illustrative process 600 to install the battery interface 202 to a battery to be located within a battery compartment and enclosed by a battery cover. The process 600 is illustrated as a collection of blocks in a logical flow graph. The order in which the operations are described is not intended to be construed as a limitation, and any number of the described blocks can be combined in any order and/or in parallel to implement the process.

At 602, solder, a conductive epoxy, or conductive tape is applied to a first end of each of two wires. In some embodiments, the wires may be metallic conductive tape, such as copper tape.

At 604, the first ends of the wires are placed on each of the positive (+) and negative (−) battery terminals of the battery 104 such that each wire is contacting only one terminal.

At 606 the wires are secured to the battery terminals with insulating film. In some embodiments, the insulating film may be all-polyimide film such as Kapton™ made from DuPont Kapton™ general purpose film manufactured by the DuPont Company of Wilmington, Del.

At 608, the wires (e.g., the wires 226 and 228 of FIG. 2) are affixed (e.g., soldered, secured with epoxy or conductive tape, etc.) to the battery terminals (+) and (−), respectively. When the wires are soldered to the battery terminals, flux may be applied to the battery terminals and/or areas to be soldered to create a secure connection.

At 610, insulating film is placed over the wire that is affixed to the negative (−) terminal (e.g., the wire 228 of FIG. 2) of the battery 104. The insulating film may completely cover the wire.

At 612, a third wire (e.g., the wire 230 of FIG. 2) is placed over the negative (−) terminal of the battery and over the insulating film applied at the operation 610. The third wire is used to contact the negative (−) terminal of the electronic device 102, and thus, via a shunt connector, complete a circuit to enable powering the electronic device with power from the battery 104.

At 614, the third wire is secured to the battery 104. For example, the isolating film may be placed over the third wire away from the end adjacent (over) the negative (−) battery terminal and thus leaving the end of the third wire exposed for contact to the negative (−) terminal of the electronic device 102.

At 616, the wires are routed to the battery interface 202 and affixed (via solder, epoxy, tape, etc.) to respective pads of the connector pads 216 in accordance with the labels 304 such that each battery terminal and electronic device terminal align with the respective pads as designated by the labels 304. In some embodiments, the battery interface 202 may be inverted to enable connection of the wires to the battery interface without having the wires cross one another. For example, depending on the polarity arrangement of the battery (i.e., position of (+) and (−) terminals on battery), the battery interface may be inverted to make a direct and shortest-route connection with the wires.

At 618, the battery 104 is secured into the electronic device 102. When secured, the third wire may contact a respective terminal on the electronic device 102. The battery interface may project outside the electronic device 102 while enabling attachment and/or closure of the battery cover 208 to seal the battery compartment 204. For example, a flexible portion of the battery interface 202 may bend away from the battery, through a seam defined between the battery door and the housing of the electronic device, and exterior to the electronic device to enable connection of the analysis device 110.

At 620, the battery interface 202 may then be coupled to the analysis device 110 via the coupling device 108 and the connector 112. The electronic device 102 may be operated by a human or a simulator device, while powered with the battery 104 situated within the battery compartment 204 and enclosed by the battery cover 208.

CONCLUSION

Although the techniques have been described in language specific to structural features and/or methodological acts, it is to be understood that the appended claims are not necessarily limited to the specific features or acts described. Rather, the specific features and acts are disclosed as exemplary forms of implementing such techniques.

What is claimed is:
1. A battery analysis interface comprising:
a flexible layered cable having a first end configured to connect to battery terminals and a terminal of an electronic device and a second end configured to connect to an analyzer device to measure performance of the battery powering the electronic device, the flexible layered cable configured to enable the battery to be secured within the electronic device and enclosed by a battery cover such that the flexible layered cable does not interfere during attachment of the battery cover of the electronic device when the flexible layered cable is connected to the battery terminals.

2. The battery analysis interface as recited in claim 1, further comprising a pin connector located proximate the second end to couple to a complementary plug in connection to the analyzer device.

3. The battery analysis interface as recited in claim 2, wherein the pin connector is a 12 pin connector.

4. The battery analysis interface as recited in claim 1, further comprising conductor strips that complete a connection between the flexible layered cable and positive (+) and negative (−) terminals on the battery and a negative (−) terminal on the electronic device.

5. The battery analysis interface as recited in claim 4, wherein the first end includes a positive (+) battery terminal pad, a negative (−) battery terminal pad, and a negative (−) electronic device pad to receive the conductor strips.

6. The battery analysis interface as recited in claim 1, wherein the first end includes a positive (+) battery terminal pad, a negative (−) battery terminal pad, and a negative (−) electronic device pad to receive the conductor strips, the respective pads being accessible from either a top or bottom of the flexible layered cable to accommodate multiple battery polarity configurations.

7. The battery analysis interface as recited in claim 1, wherein the flexible layered cable has a thickness of less than or equal to 0.1 inches to enable bending of the flexible layer cable through a seam between the battery cover and a housing of the electronic device.

8. The battery analysis interface as recited in claim 1, wherein the flexible layered cable includes shunt pads located between a first negative connector pad and a second negative connector pad.

9. A battery measurement system comprising;
a battery configured to operate a battery-powered electronic device that includes an internal battery compartment enclosed by a battery cover;
a battery analysis interface having a first end to connect to terminals of the internal battery and the battery-powered electronic device and a second end having a coupling device; and
an analysis device to analyze performance of the battery while the battery powers the electronic device, the analysis device coupled to the battery analysis interface via the coupling device.

10. The battery measurement system as recited in claim 9, wherein the battery analysis interface includes conductor strips that complete a connection between connector pads on the first end and positive (+) and negative (−) terminals on the internal battery and a negative (−) terminal on the electronic device.

11. The battery measurement system as recited in claim 10, wherein the connector pads include a positive (+) battery terminal pad, a negative (−) battery terminal pad, and a negative (−) electronic device pad to receive the conductor strips.

12. The battery measurement system as recited in claim 9, wherein the battery powered electronic device is a telecommunication device.

13. The battery measurement system as recited in claim 9, wherein the battery analysis interface is a layered flex cable that has a thickness of less than or equal to 0.1 inches.

14. The battery measurement system as recited in claim 9, wherein the battery analysis interface is secured to the battery.

15. The battery measurement system as recited in claim 9, wherein the battery analysis interface infiltrates a seam of the battery cover to gain access to the battery terminals while the battery cover is attached to the battery-powered electronic device.

16. A method of instrumenting a battery that powers an electronic device to allow monitoring of battery performance while the battery is located within the electronic device, the method comprising:
connecting a first end of a battery interface to the battery;
inserting the battery within the electronic device;
placing a cover over the battery, the cover being affixed to the electronic device; and
connecting an exposed end of the battery interface that is external to the electronic device to an analysis device to enable measurement of the battery performance while the electronic device is in operation.

17. The method as recited in claim 16, wherein the connecting the first end of the battery interface to the battery includes:
securing an end of a first wire to a positive (+) battery terminal and an end of a second wire to a negative (−) battery terminal;
securing the second wire with an insulating film;
placing a third wire over the insulating film and over the negative (−) battery terminal while not contacting the second wire; and
securing the wires to respective connector pads on the battery interface.

18. The method as recited in claim 17, further comprising:
securing the wires to the battery with insulating tape; and
securing the battery interface to the battery with insulating tape.

19. The method as recited in claim 17, further comprising positioning the battery interface on a side that aligns the respective connector pads with the polarity of the battery to avoid crossing any of the respective wires.

20. The method as recited in claim 16, further comprising connecting the analysis device to a computer device running software to record the battery performance.

* * * * *